United States Patent
Krijnen (10) Patent No.: US 7,315,032 B2
(45) Date of Patent: Jan. 1, 2008

(54) LITHOGRAPHIC APPARATUS AND A DEVICE MANUFACTURING METHOD

(75) Inventor: Edwin Eduard Nicolaas Josephus Krijnen, Oss (NL)

(73) Assignee: ASML Netherlands B.V., Veldhoven (NL)

(*) Notice: Subject to any disclaimer, the term of this patent is extended or adjusted under 35 U.S.C. 154(b) by 230 days.

(21) Appl. No.: 10/847,660

(22) Filed: May 18, 2004

(65) Prior Publication Data

US 2005/0260779 A1    Nov. 24, 2005

(51) Int. Cl.
*A01J 5/00* (2006.01)

(52) U.S. Cl. .................. 250/492.1; 378/34; 378/35; 250/492.2; 250/491.1

(58) Field of Classification Search ............ 250/492.1, 250/522.1
See application file for complete search history.

(56) References Cited

U.S. PATENT DOCUMENTS

| | | | | |
|---|---|---|---|---|
| 5,775,666 | A * | 7/1998 | Tsukamoto et al. | 267/140.13 |
| 6,538,720 | B2 * | 3/2003 | Galburt et al. | 355/53 |
| 6,633,366 | B2 * | 10/2003 | de Jager et al. | 355/67 |
| 6,784,978 | B2 * | 8/2004 | Galburt | 355/72 |
| 6,809,323 | B2 * | 10/2004 | Hazelton | 250/442.11 |
| 2001/0011712 | A1 * | 8/2001 | Castenmiller et al. | 250/548 |
| 2002/0089657 | A1 * | 7/2002 | Okubo | 355/76 |
| 2002/0118346 | A1 * | 8/2002 | Galburt et al. | 355/53 |
| 2002/0163631 | A1 * | 11/2002 | Sogard | 355/74 |
| 2003/0164931 | A1 * | 9/2003 | Galburt et al. | 355/53 |

* cited by examiner

*Primary Examiner*—Jack I. Berman
*Assistant Examiner*—Johnnie L Smith, II
(74) *Attorney, Agent, or Firm*—Pillsbury Winthrop Shaw Pittman LLP (57) ABSTRACT

A lithographic apparatus including an illumination system configured to provide a beam of radiation; a support configured to support a patterning device, the patterning configured to impart the projection beam with a pattern in its cross-section; a substrate table configured to hold a substrate; a projection system configured to project the patterned beam onto a target portion of the substrate; at least one mounting bracket configured to couple a second part of the apparatus to a first part thereof, the mounting bracket including a first rigid part, a second rigid part, and an elastic part connecting the first and second rigid parts, wherein a fixing mechanism is provided to fix the positions of the first rigid part and the second rigid part with respect to each other, the elastic part being less rigid than each of the rigid bracket parts, and the fixing mechanism is configured to couple the first and second rigid parts of the mounting bracket substantially by form fixation.

58 Claims, 4 Drawing Sheets

LITHOGRAPHIC APPARATUS AND A DEVICE MANUFACTURING METHOD

BACKGROUND OF THE INVENTION

1. Field of the Invention

The present invention relates to a lithographic apparatus, a device manufacturing method and a device manufactured thereby.

2. Description of the Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. including part of one or several, dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or antiparallel to this direction.

Generally, the lithographic apparatus includes various components which are mounted to one another. For example, sensors, optical elements and other components are coupled to one or more suitable frames, mounting surfaces or other surfaces within the apparatus. In many instances the mounting has to be such that a certain alignment of components can be guaranteed. Herein, positioning tolerances are usually very small, for example, in the micrometer range or less, for meeting the desired specifications of the lithographic apparatus. In many cases, positioning has to be relatively precise along each of the three Cartesian coordinate axes x, y, z, as well as in respective rotation directions about these x, y and z-axes. Besides, many of the components have to be mounted stably in the apparatus, so that a desired position can be upheld over long operating periods.

Furthermore, it is desired to obtain a construction which is well defined in a mechanical point of view. Effects of stresses, mechanical forces and/or torques on any statically overdetermined connection between parts of the apparatus may be hard or impossible to predict. Therefore, such statically overdetermined constructions may lead to unpredictable positioning faults in the lithographic apparatus during the use thereof.

Besides, it is also generally desired to remove parts from the apparatus, for example, during maintenance work or the like. In that case, it is desired to remount the removed parts relatively fast, in exactly the same position. Thus, there has to be a good reproducibility of the mounting of apparatus parts, wherein desired small positioning tolerances can be met over and over again.

SUMMARY OF THE INVENTION

It is an aspect of the present invention to provide a lithographic apparatus, wherein parts of the apparatus can be mounted precisely to each other in desired locations.

It is also an aspect of the present invention to provide a lithographic apparatus, wherein one or more parts of the apparatus can be mounted, and an alignment position of one or more of the parts can be upheld during the mounting in a simple manner.

Besides, another aspect of the present invention is to provide a mounting bracket arrangement configured to prevent a statically overdetermined mounting of one or more apparatus parts.

It is further an aspect of the present invention to provide a mounting bracket which is capable of mounting a part of a lithographic apparatus in a desired location, meeting desired tolerances.

Additionally, an object of the present invention is to provide a mounting bracket which can be used to mount at least one part of a lithographic apparatus with high reproducibility.

According to an aspect of the present invention, there is provided a lithographic apparatus including an illumination system configured to condition a beam of radiation; a support configured to support a patterning device, the patterning device configured to impart the beam with a pattern in its cross-section; a substrate table configured to hold a substrate; a projection system configured to project the patterned beam onto a target portion of the substrate; and at least one mounting bracket configured to couple a second part of the apparatus to a first part thereof, the mounting bracket comprising a first rigid parts, a second rigid part, and an elastic part connecting the first and second rigid part, the elastic part being less rigid than each of the rigid bracket parts, wherein a fixing mechanism is configured to fix the positions of the first rigid part and the second rigid part with respect to each other, and the fixing mechanism is configured to couple the first and second rigid parts of the mounting bracket substantially by form fixation.

Since the apparatus is provided with the at least one mounting bracket, the first and second apparatus part can be mounted relatively precisely to each other in desired locations. For example, during mounting, the first apparatus part is connected to the first rigid part, wherein the second apparatus part is connected to the second rigid bracket part. Then, also during mounting, the first and second bracket parts are fixed to each other by form fixation, leading to a relatively stiff mounting bracket. Furthermore, the stiffness of the mounting bracket is controllable relatively well because of the form fixation, for example, with respect to a bracket using force fixation. Besides, during the application of the fixing mechanism, particularly for stiffening the mounting bracket, there is only little or no drift between the first and second rigid bracket parts because of the form fixation, particularly with respect to force fixation. Consequently, the first and second apparatus parts are coupled to each other by a relatively stiff mounting bracket, so that the coupling can be accurate, meeting small positioning tolerances. Also, the mounting bracket can provide a coupling with good alignment reproducibility because of the fixing mechanism for coupling the first and second rigid part of the mounting bracket substantially by form fixation.

The elastic part of the mounting bracket can provide a certain mechanical decoupling of the first and second rigid bracket parts, for mechanically decoupling the first and second apparatus part, particularly after assembly and when the form fixation has been removed. The elastic part may serve, for example, to remove a statically overdetermined situation after assembly, so that apparatus parts can be held in desired positions with high predictability. According to a further aspect of the invention, the fixing mechanism comprises a cavity which extends between opposite parts of the first and second rigid parts of the mounting bracket, wherein the fixing mechanism includes a blocking member which fits in the cavity, wherein the cavity and blocking member are arranged to cooperate with each other for providing the form fixation.

This provides a relatively compact, simple and inexpensive arrangement for providing the form fixation. Therefore, the form fixation can be applied when there is relatively little space available, so that a desired compactness of the lithographic apparatus can be achieved or maintained.

The cavity may be spaced-apart from the elastic part. Furthermore, the cavity may be, for example, cylindrical. In that case, the blocking member may be, for example, a cylindrical bush. The cylindrical cavity and cylindrical bush can provide a relatively homogeneous and stable form fixation. Then the bush and the cavity fit by a clearance fit or a transition fit, for example, a ISO286H6/h6 fit, for accomplishing a desired form fixation. The manufacturability of the ISO fit is relatively good. The center axis of the cavity may extend, for example, in a virtual plane, which plane extends between opposite surfaces of the opposite parts of the first and second rigid part of the mounting bracket. Then, the fixing mechanism may provide, for example, at least a form fixed stiffening of the bracket in a direction which is parallel to the virtual plane and perpendicular to the centre axis.

Furthermore, according to the present invention, the blocking member may extend substantially parallel to a virtual pivot axis of the elastic part, for providing a desired form fixation.

According to an other aspect of the invention, the blocking member is removable from the cavity. The removal of the blocking member can provide a desired removal of a bracket stiffness, which stiffness is due to the form fixation, so that a second rigid bracket part can be mechanically decoupled in a certain manner from the first rigid bracket part. According to an embodiment, the blocking member is elastically deformable to a blocking state wherein the blocking member blocks the first and second rigid parts of the bracket via form fixation in the cavity.

Thus, when in the blocking state, the blocking member provides the form fixation of the first and second rigid bracket part. When the blocking member is not in the blocking state but, for example, in a suitable releasing state, the form fixation may be at least partly undone. When the blocking member is not in the blocking state, the blocking member may, for example, be removable from the cavity. For the case that the blocking member is a bush, the bush may be elastically deformable, for example, over about 16 μm. The bush may also be elastically deformable over another distance, depending, for example, on the overall dimensions of the bush and the cavity.

A deformation mechanism may be provided for elastically deforming the blocking member to the blocking state. The deformation mechanism can be used for controlling the state of the blocking member, so that the form fixation can be applied or at least partially undone, as desired. For example, the deformation mechanism may simply include a bolt, wherein the bolt and the blocking member are arranged to cooperate with each other for elastically deforming the blocking member to the blocking state. Then, the bracket may, for example, include an aperture for receiving the bolt. In one embodiment, the bolt extends substantially perpendicular to the blocking member. Besides, the bolt may be removable from the bracket, for the case that the bolt does not have to be used in deforming the blocking member, and/or when it is desired to remove the blocking member from the bracket. The bolt may extend substantially perpendicular to a horizontal virtual pivot axis of the elastic bracket part, such that the center line of the bolt intersects that pivot axis, when viewed in a vertical cross-section of the bracket.

In that case, a construction can be obtained wherein relatively little or substantially no torques are applied to the bracket during the mounting of the blocking member, particularly torques which could result in a drift of the positioning of the first and second rigid parts with respect to one another.

The first apparatus part and second apparatus part, which are coupled to each other by the mounting bracket, may include various apparatus parts. As an example, the first part of the apparatus may be a frame part. The second part of the apparatus may include, for example, at least one sensor. Also, the second part of the apparatus may be arranged for aligning different objects with respect to each other. The second part of the bracket may be arranged for determining the position of the substrate in at least one translation and/or rotational direction. Furthermore, the second part of the apparatus may include at least one optical element. The optical element may be, for example, a mirror, a lens, or a prism.

In an embodiment of the invention, the first and second rigid parts form a substantially L-shaped bracket. For example, the first and second rigid parts may each be formed as bracket arms. Furthermore, the first rigid part, second rigid part and elastic part of the bracket are made in one piece. The bracket may be made of at least one metal, leading to a relatively solid, strong and robust bracket. For example, the bracket may be a solid piece of metal.

The thickness of the elastic part of the bracket may be, for example, smaller than the thickness of the first and second rigid parts of the bracket, when viewed in a longitudinal cross-section of the bracket, such that the elastic part is less rigid than each of the rigid parts. The thickness of the elastic part may be, for example, such that the elastic part has a rigidity of about 30% or less of the rigidity of the rigid bracket parts. The elastic bracket part may have, for example, a thickness of less than half the thickness of the first rigid bracket part. Also, the elastic bracket part may have a thickness of about 2 cm or less, depending, for example, on the overall dimensions of the bracket.

In an embodiment, the bracket includes at least one slot which extends between the first and second rigid part for providing the elastic parts of the bracket. For example, the bracket may include at least a first slot and an adjoining second slot, wherein the first slot extends substantially parallel to the longitudinal direction of first rigid bracket part, wherein the second slot extends from the first slot towards the elastic bracket part. By providing one or more such slots, the elastic bracket part can be provided in the bracket as such, so that the elastic part is an integral part of the bracket. Therefore, the bracket is relatively durable and includes relatively little parts, being made of one piece only.

Further, according to the invention, the fixing mechanism may fix the first and second rigid part of the mounting bracket substantially by form fixation when the fixing mechanism is in a fixing position, wherein the fixing mechanism releases the first and second rigid part of the mounting bracket when the fixing mechanism is in a releasing position.

This provides the above-mentioned advantages, particularly concerning the stiffening of the bracket on the one hand and removing of the stiffness of the bracket on the other. After the releasing, when the fixing mechanism is in the releasing position, the first and second bracket rigid part are particularly only connected to each other by the elastic bracket part.

The bracket may be removable from the apparatus after the bracket has been mounted in the apparatus, for example, for removing the second part of the apparatus from the first apparatus part. In that case, the bracket may be removed, for example, during or for maintenance of the apparatus or the like. After the removal, the bracket may be installed again in the apparatus. Then, by utilizing the form fixation, the position of the second apparatus part can be reproduced accurately.

According to an other aspect of the invention, there is provided a lithographic apparatus including an illumination system configured to provide a beam of radiation; a support configured to support a patterning device, the patterning device configured to impart the projection beam with a pattern in its cross-section; a substrate table configured to hold a substrate; a projection system configured to project the patterned beam onto a target portion of the substrate; at least one mounting bracket configured to couple a second part of the apparatus to a first part thereof, the mounting bracket including a first rigid part, a second rigid part, and an elastic part connecting the first and second rigid parts, the elastic part being less rigid than each of the rigid parts wherein a removable blocking member is provided for coupling the first and second rigid part of the mounting bracket substantially by form fixation.

During use, the first and second part of the apparatus may be connected to one another by the mounting bracket, the first and second rigid parts of the bracket are coupled to one another by form fixation for stiffening the bracket. In that case, substantially no, or only very little force, particularly substantially no wringing force, is used, so that substantially no drift of the respective positions of the rigid parts arises when stiffening the bracket. Thus, the bracket can position the first and second apparatus part stably and precisely, in a certain configuration, with respect to one another. For example, the mounting bracket can be used during assembly of the apparatus, when, for example, the second apparatus part has to be installed in the apparatus in a certain location and/or orientation.

The stiffened mounting bracket can be used to retain the first and second apparatus parts in desired positions when the apparatus is not in operation and/or during transportation of the apparatus. Transportation of the apparatus may lead to certain vibrations which could hamper any desired positioning of apparatus parts. The present mounting bracket may prevent any undesired vibration caused repositioning of a first and second apparatus part with respect to one another.

Furthermore, the blocking member is removable. After removal of the blocking member, the elastic part of the bracket provides a certain elasticity between the first and second rigid part, and therefore also between the first and second apparatus part. This elasticity may, for example, prevent vibrations passing from the first apparatus part to the second apparatus part, or vice-versa. Also, the elastic part of the bracket may provide a statically well determined connection or mounting of one of the apparatus parts, for example, the second apparatus part with respect to the first part.

The present mounting bracket can be used during disassembly of the apparatus when the second apparatus part has to be disconnected to the first apparatus part. In that case, the blocking member is applied to the mounting bracket for coupling the first and second rigid part of the mounting bracket substantially by form fixation, particularly for stiffening the bracket. Then, the position of the first and second rigid part can be ensured relatively well, during relatively long periods of time. Next, the relatively stiff mounting bracket can be removed from the apparatus. The bracket may be disconnected from the first apparatus part, but not from the second apparatus part, for removing the second apparatus part from the apparatus. After a certain time period, for example, relating to maintenance, the form-fixed mounting bracket, still retaining the second apparatus part, can be returned to the apparatus and connected to the first apparatus part. Consequently, the second apparatus part has again been coupled to the first apparatus part, preferably in exactly the same position as before. Then, the blocking member may be removed from the mounting bracket, for releasing the elasticity of the elastic bracket part.

The present invention further provides a bracket for coupling a second part of a lithographic apparatus to a first part thereof, wherein the bracket is specifically suitable and adapted for use in an apparatus according to the present invention.

According to an aspect of the invention, there is provided a bracket for coupling a second part of a lithographic apparatus to a first part thereof, wherein the bracket includes a first rigid part, a second rigid part, and an elastic part connecting the first and second rigid part, the elastic part being less rigid than each of the rigid bracket parts, wherein a fixing mechanism is provided for fixing the positions of the first rigid part and the second rigid part with respect to each other, wherein the fixing mechanism is arranged to couple the first and second rigid part of the mounting bracket substantially by form fixation.

The bracket may provide a durable positioning of the first and second apparatus part with respect to one another via the form fixation of the bracket parts. Also, when the form fixation has been removed, the bracket may provide a certain mechanical decoupling of the first and second apparatus part.

According to an other aspect of the invention, there is provided a bracket for coupling a second part of a lithographic apparatus to a first part thereof, the bracket including a first rigid part, a second rigid part, and an elastic part connecting the first and second rigid part, the elastic part being less rigid than each of the rigid bracket parts, wherein a removable blocking member is provided for coupling the first and second rigid part of the mounting bracket substantially by form fixation.

The removable blocking member may be applied for blocking elastic movement of the first rigid part and second rigid part of the bracket with respect to each other, particularly elastic movement resulting from the elasticity of the elastic part of the bracket. Also, the blocking member serves to stiffen the bracket. This is advantageous, for example, during the installation of the second apparatus part, during removal of the second apparatus part and/or during transportation of the apparatus. When the blocking member has been removed, the first rigid part and second rigid part of the bracket are only connected by the elastic part, for example, for providing a certain mechanically decoupling and/or a statically defined coupling of the first and second apparatus part with respect to each other.

According to a further aspect of the invention, there is provided a device manufacturing method including:

projecting a patterned beam of radiation onto a target portion of a substrate, and coupling a first part of a lithographic apparatus to a second part using a mounting bracket according to the present invention.

By using the apparatus or the at least one bracket, at least a first apparatus part and at least a second apparatus part can be positioned relatively precisely with respect to each other. The bracket can be stiffened using form fixation. Thus, a desired positioning of one or more respective apparatus parts can also be upheld during long periods of time, for example, during transportation of the apparatus and/or during maintenance on the apparatus. Also, since the bracket is not stiffened by form fixation, respective apparatus parts can be mechanically decoupled in a certain way, in particular during operation of the apparatus. Therefore, devices can be made with high precision, with desired small tolerances. Also, the throughput of the overall method is relatively high, particularly when including the maintenance periods, since a desired positioning of the first and second apparatus parts can be upheld relatively well using the bracket(s), so that little time has to be lost in reinstalling, recalibrating and/or repositioning such apparatus parts.

The present invention also provides a device manufactured according to the to the above-referenced device manufacturing method and/or by the above-referenced lithographic apparatus.

This device can be made accurately, with very high precision. Such precision may be achieved, for example, relatively soon after the apparatus has been assembled or reassembled, when using at least of the mounting bracket for coupling at least one first apparatus part to at least a second apparatus part.

The present invention further provides a method for mounting a second part of a lithographic apparatus to a first part of the apparatus, wherein a mounting bracket is used for coupling the second part of the apparatus to the first part thereof, wherein the mounting bracket comprises a first rigid part, a second rigid part, and an elastic part connecting the first and second rigid part, the elastic part being less rigid than each of the rigid bracket parts, wherein the first and second rigid part of the mounting bracket are being fixed to each other substantially by form fixation during the mounting of the bracket.

As follows from the above, the form fixation provides a well controllable stiffening of the mounting bracket, so that the apparatus parts can be installed accurately with respect to each other. The form fixation may be removed after the mounting of the bracket, for example, to make use of the elasticity of the elastic bracket part.

The invention also provides a method for removing a second part of a lithographic apparatus from a first part of the apparatus, wherein the first part of the apparatus has been connected to a first rigid part of the bracket, wherein a second bracket rigid part has been provided with the second apparatus part, wherein the mounting bracket comprises an elastic part connecting the first and second rigid part, the elastic part being less rigid than each of the rigid parts, wherein the first and second rigid part of the mounting bracket are being fixed to each other substantially by form fixation, after which the mounting bracket is being disconnected from the first apparatus part, to be removed from the apparatus.

Therefore, the bracket can be stiffened, wherein a certain drift of the second bracket rigid part with respect to the first rigid part can be prevented, so that a desired operation position of the second apparatus part can be substantially guaranteed when the bracket and the second apparatus part are reinstalled, i.e. coupled to the first apparatus part, after a certain period of time.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example, a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each instance of patterning device, the support structure may be a frame or table, for example, which may be fixed or movable as required and which may ensure that the patterning device is at a desired position, for example, with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

Embodiments of the present invention will now be described, by way of example only, with reference to the accompanying schematic drawings in which corresponding reference symbols indicate corresponding parts.

DETAILED DESCRIPTION

Figure 1:
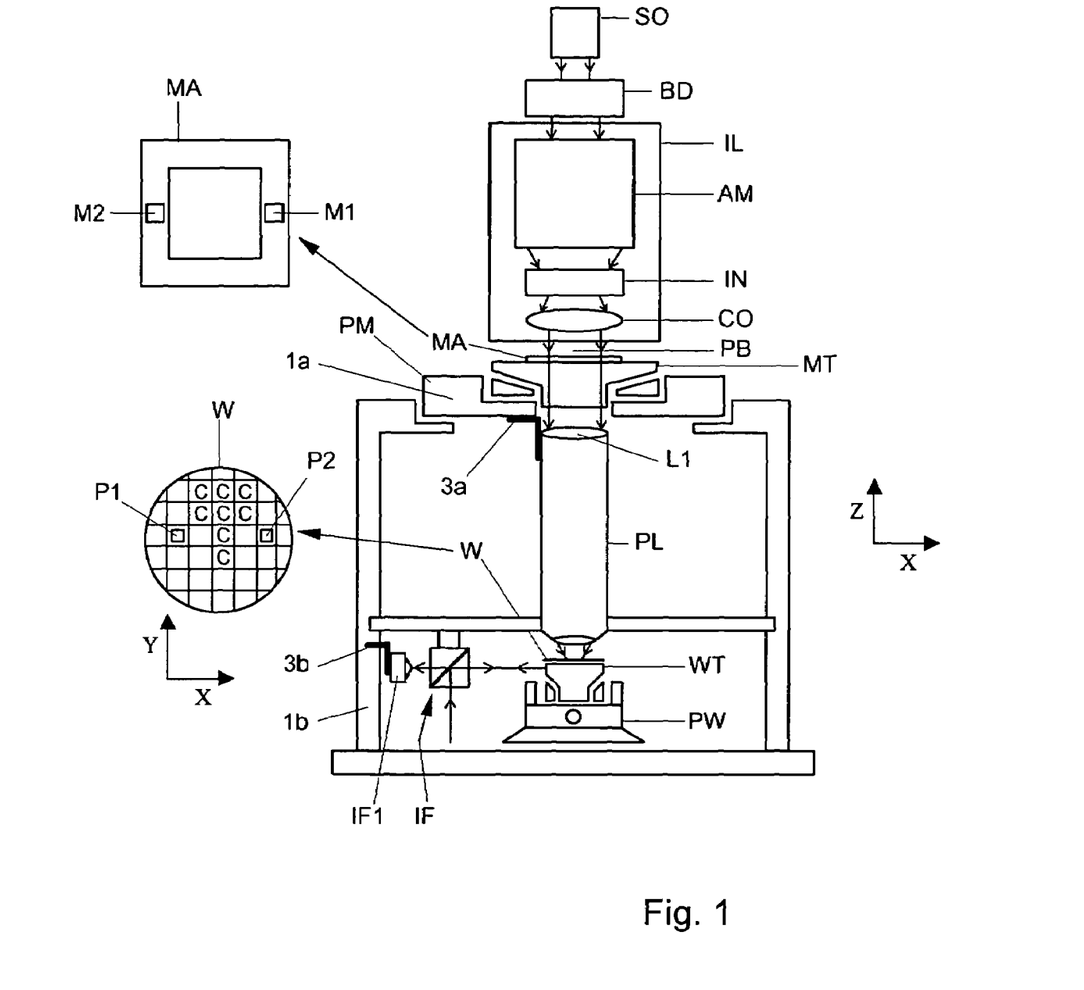
FIG. 1 depicts a lithographic apparatus according to an embodiment of the invention.

FIG. 1 schematically depicts a lithographic apparatus including an illumination system (illuminator) IL that provides a beam PB of radiation (e.g. UV radiation or an other type of radiation). A first support structure (e.g. a mask table) MT supports a patterning device (e.g. a mask) MA and is connected to a first positioning device PM that accurately positions the patterning device with respect to a projection system item PL; a substrate table (e.g. a wafer table) WT holds a substrate (e.g. a resist coated wafer) W and is connected to a second positioning device PW that accurately positions the substrate with respect to the projection system PL.

The projection system (e.g. a refractive projection lens) PL for imaging a pattern imparted to the projection beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives radiation from a radiation source SO. The source and the lithographic apparatus may be separate entities, for example, when the source is an excimer laser. In such cases, the source is not considered to form part of the lithographic apparatus and the radiation is passed from the source SO to the illuminator IL with the aid of a beam delivery system BD including, for example, suitable directing mirrors and/or a beam expander. In other cases the source may be integral part of the apparatus, for example, when the source is a mercury lamp. The source SO and the illuminator IL, together with the beam delivery system BD if required, may be referred to as a radiation system.

The illuminator IL may include an adjusting device AM that adjusts the angular intensity distribution of the beam. Generally, at least the outer and/or inner radial extent (commonly referred to as s-outer and s-inner, respectively) of the intensity distribution in a pupil plane of the illuminator can be adjusted. In addition, the illuminator IL generally includes various other components, such as an integrator IN and a condenser CO. The illuminator provides a conditioned beam of radiation PB, having a desired uniformity and intensity distribution in its cross-section.

The beam PB is incident on the mask MA, which is held on the mask table MT. Having traversed the mask MA, the beam PB passes through the projection system lens PL, which focuses the beam onto a target portion C of the substrate W With the aid of the second positioning device PW and a position sensor IF (e.g. an interferometric device), the substrate table WT can be moved accurately, e.g. so as to position different target portions C in the path of the beam PB. Similarly, the first positioning device PM and another position sensor (e.g. an interferometric device which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

As shown in FIG. 1, the apparatus comprises substantially L-shaped mounting brackets 3 for connecting various apparatus parts to one another. Schematically, a first mounting bracket 3a has been shown for coupling a lens L1 of the projection system to a first frame part 1a of the apparatus. Also, a second mounting bracket has been shown which couples a position sensor IF1 to a second frame part 1b of the apparatus. Similar brackets 3 may be applied for connecting other apparatus parts to each other.

Figure 2:
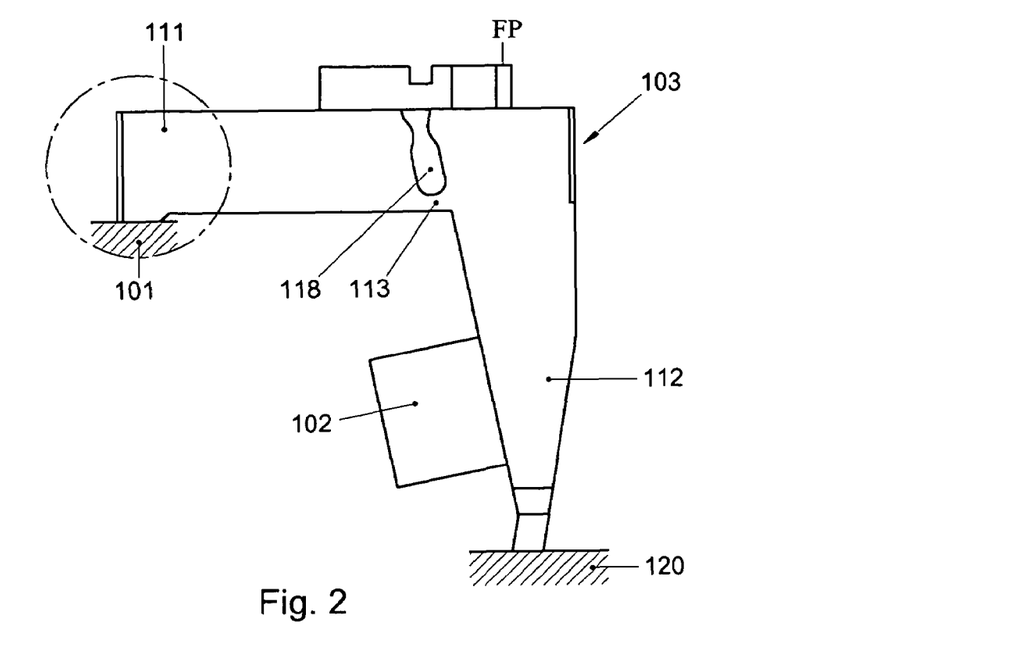
FIG. 2 depicts a mounting bracket, in side view, being provided with force fixation means.

In many cases, it is desired to connect apparatus parts stably and in a statically well defined manner. FIG. 2 shows a substantially L-shaped mounting bracket 103, including a substantially horizontal first arm 111, a substantially vertical second arm 112, and an elastic part 113 connecting the first and second arms 111, 112. The first arm 111, second arm 112 and elastic part 113 are made in one piece. The elastic part 113 is a relatively narrow integral part of the bracket, abutting an elongated slot 118 extending between the first and second bracket arms 111, 112. The elastic part has a hinging function, providing an elastic hinge between the bracket arms 111, 112 during operation of the apparatus. The second arm 112 is provided with a second apparatus part 102, for example, a position sensor. After mounting, the lower end of the second arm 112 of the bracket 103 is supported on and/or attached to a supporting apparatus part 120. The end of the first bracket arm 111, extending away from the second arm 112, is supported on a first apparatus part 101, for example, a frame part or the like.

In FIG. 2, a fixing plate FP fixes the positions of the first arm 111 and second arm 112 with respect to each other using force fixation. The fixing plate FP is coupled to both arms 111, 112 of the bracket by bolts, not shown in the figure. The fixing plate FP may be used, for example, during the installation of the mounting bracket in the apparatus and/or when the mounting bracket is removed from the apparatus. During such installation and/or removal, the second apparatus part 102 is usually already connected to the second bracket arm 112. Thus, the bracket 103 can be used for installation and/or removal of the second apparatus part 102 with respect to the apparatus.

When the fixing plate FP has been removed from the bracket 103, the elastic part 113 provides a certain decoupling of the second bracket arm 112 from the first bracket arm 111. This provides a statically well defined coupling of the second apparatus part 102 to the first apparatus part 101, for example, during use of the apparatus for performing a method for manufacturing devices with high precision. The elastic part, serving as a hinge, avoids an over-constraint situation after the bracket has been built in the apparatus. Also, the elastic bracket part 113 may serve to prevent certain vibrations being transferred to the second apparatus part 102.

The fixing plate FP and the accompanying bolts apply relatively large forces onto the mounting bracket 103 when attached thereto. Such forces may lead to a repositioning of the first and second bracket arms 111, 112, hampering the desired positioning of the second apparatus part 102 with respect to the fist apparatus part 101. The fixing plate FP retains the first and second bracket arms 111, 112 by friction, particularly by friction surfaces pressed together. In many instances, such friction is not sufficient to withstand external mechanical forces or accelerations, for example, during transportation and/or handling of the bracket 103, leading to a loosening of the fixing plate FP and/or an undesired repositioning of the bracket arms 111, 112.

FIGS. 3-7 show a mounting bracket 3 for coupling a second part 2 of the apparatus to a first part 1 according to the present invention. The bracket 3 is substantially L-shaped. The bracket may have various other shapes, depending amongst others on the desired application and dimensions of a final mounting area of the bracket. The bracket 3 includes a first elongated arm 11, a second elongated arm 12, and an elastic part 13 connecting the first and second arms 11, 12. Each of the arms 11, 12 may have, for example, a square or rectangular transversal cross-section. A fixing mechanism is provided for fixing the positions of the first arm 11 and the second arm 12 with respect to each other. The first arm 11, second arm 12 and elastic part 13 of the bracket are made in one piece. For example, the bracket 3 may be substantially solid, as well as made of at least one metal. Also, the elastic part 13 of the bracket 3 is relatively narrow viewed in a longitudinal cross-section of the bracket. The elastic part connects the first and second bracket arms 11, 12. The elastic part desirably has a thickness T of less than half the thickness of the first bracket arm, measured in a direction perpendicular to the first bracket arm. For example, the elastic part may have a thickness T of about 15 mm or less, measured in the transversal direction perpendicular to the first bracket arm, depending on the overall dimensions of the bracket. The bracket 3 also includes at least one slot 18, 19 which extends between the first and second arms for providing the elastic part of the bracket. Depending on the overall dimensions of the bracket, the elastic part may have various other dimensions, for example, having a thickness of more than 15 mm or over 2 cm. The dimensions of the elastic part also depend on a desired elasticity of that part.

The mounting bracket 3 includes at least a first, relatively narrow slot 18 and an adjoining second, relatively wide slot 19. The first slot 18 extends from the bottom of an upper groove 21 in a direction which is substantially parallel to the longitudinal direction of first bracket arm, into the second slot 19. The first slot 18 is spaced apart from the elastic bracket part 13. The second slot 19 substantially extends downward under a certain angle with respect to the longitudinal direction of the first arm 11, towards the elastic part 13. Viewed in side view, as in FIG. 4, the first and second slot 18, 19 separate a substantially triangular part 5 of the second arm 12 from the first arm 11.

A fixing mechanism 14, 15, 16 is arranged to couple the first and second arm 11, 12 of the mounting bracket 3 substantially by form fixation. Thus, the bracket 3 can be positively locked, or in other words stiffened, by the fixing mechanism. Therefore, the respective positions of the first and second arm 11, 12 can be during application of the fixing mechanism, so that a desired exact positioning of the second apparatus part 2 with respect to the first apparatus part 1 can be obtained and maintained relatively fast and with ease. Furthermore, the form fixation provides a relatively rigid bracket, particularly in a horizontal direction, which is substantially perpendicular to the second bracket arm 12 and parallel to the first arm 11.

The fixing mechanism includes a blocking cavity 14 which extends through the first slot 18, between opposite parts 4, 5 of the first and second arms 11, 12 of the mounting bracket 3. The cavity 14 extends in a substantial horizontal direction, perpendicular to the plane of FIGS. 3, 4 and 7. Therefore, the center axis of the cavity 14 extends in a virtual plane, which plane extends between opposite surfaces of the opposite parts 4, 5 of the first and second arms 11, 12 of the mounting bracket 3. Besides, the center axis of the cavity 14 is in line with the virtual plane extending through the middle of the first slot 18.

Figure 3:
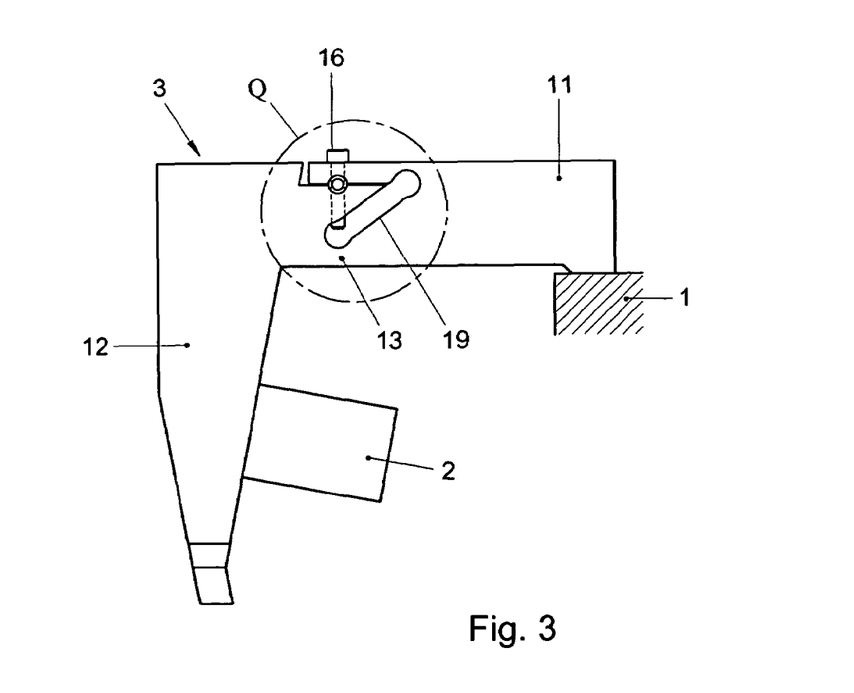
FIG. 3 is a side view of a first embodiment of a mounting bracket according to the present invention.
Figure 4:
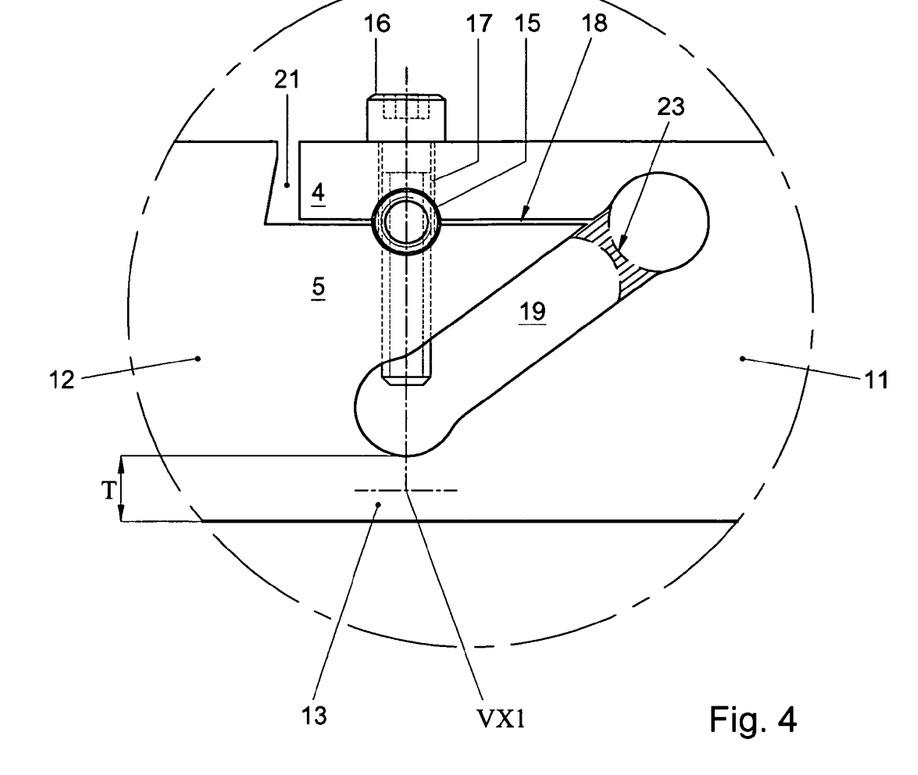
FIG. 4 is a detail Q of FIG. 3.
Figure 5:
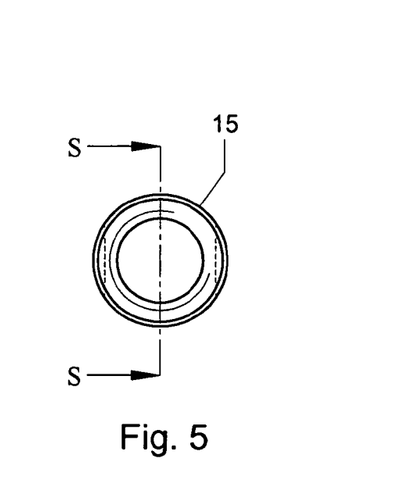
FIG. 5 is a side view of the bush/bolt form fixation mechanism of the first embodiment shown in FIG. 3.
Figure 7:
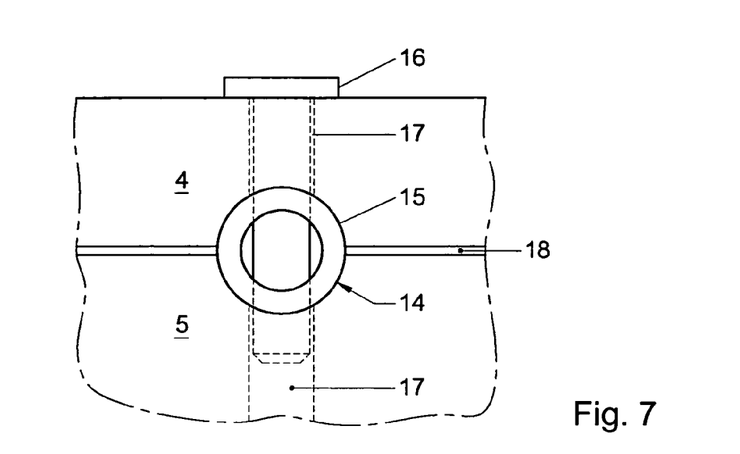
FIG. 7 schematically shows an enlarged part of a section of FIG. 4.

The fixing mechanism also comprises a blocking member 15 which fits in the cavity 14. The blocking cavity 14 and blocking member 15 are arranged to cooperate with each other for providing the form fixation. The cavity 14 is spaced-apart vertically from the elastic part 13. The cavity may be cylindrical. The respective blocking member 15 is a cylindrical bush. Particularly, the bush 15 and the cavity 14 fit tightly, for example, by the internationally standardised ISO-286H6/h6 fit. The tolerances zones used in the ISO H6/h6 fit are known. Also, a different fit may be used, depending amongst others on the dimensions of the bracket and on the desired application of the bracket. The blocking member 15 extends substantially parallel to a virtual pivot axis YX1 of the elastic part 13. The blocking member 15 may be removable from the cavity 14.

The blocking member 15 may be elastically deformable to a blocking state wherein the blocking member blocks the first and second arms of the bracket via form fixation in the cavity. For example, the blocking member 15 may be elastically deformable over about 16 μm, for reaching the blocking state when the H6/h6 fit is utilized.

Figure 6:
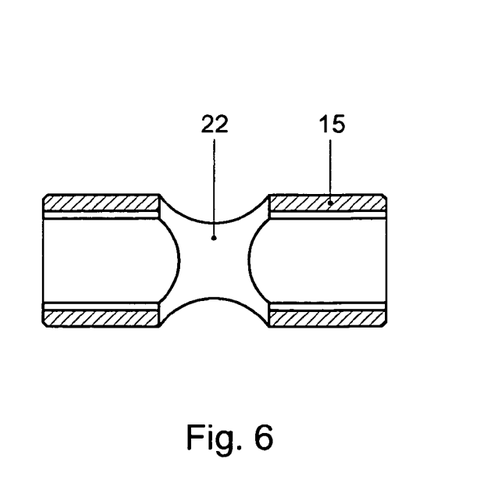
FIG. 6 is a cross-section over line S-S of FIG. 5.

A deformation mechanism for elastically deforming the blocking member 15 includes a bolt 16. The bolt 16 and the blocking member 15 are arranged to cooperate with each other for elastically deforming the blocking member to the blocking state. The blocking member 15 comprises a bolt-passage 22 for receiving the bolt 16 of the deformation mechanism, as is shown in FIG. 6. The cooperation may be achieved, for example, by suitable cooperating screw threading of the blocking member 15 and bolt 16. The bracket 3 includes an aperture 17 for receiving the bolt 16, such that the bolt extends substantially perpendicular through the blocking member 15 via the bracket aperture 17 after assembly, as well as substantially perpendicular with respect to the elastic part 13 of the bracket 3. The aperture 17 for receiving the bolt 16 extends perpendicular through the blocking cavity 14, from the top side of the bracket 3. After assembly, the center line of the bolt 16 intersects the virtual pivot axis VX1 at a substantially right angle. Also, the bolt 16 is may be removable from the mounting bracket 3.

As shown in FIG. 3, the second bracket arm 12 includes a second apparatus part 2. As in the above, the second part of the apparatus may include, for example, at least one sensor. Also, the second part of the apparatus may be arranged for aligning different objects with respect to each other. Besides, the second arm of the bracket may be arranged for determining the position of the substrate W in at least one translation and/or rotational direction, for example, using the second apparatus part 2. On the other hand, the second part of the apparatus may include at least one optical element, for example, a mirror or a lens.

The fixing mechanism can fix the first and second arm 11, 12 of the mounting bracket 3 substantially by form fixation when the fixing mechanism is in a fixing position. In this fixing position the bolt 16 of the deformation mechanism has been installed such that the bolt elastically deforms the blocking member 15 to its blocking state. In this blocking state, the blocking member 15 provides a form fixation of the first and second bracket arms, in a horizontal direction, parallel to the first bracket arm 11. Also, the blocking member 15 and bolt 16 stiffen the mounting bracket 3. Therefore, the positions of the first and second bracket arms 11, 12 can be maintained with respect to each other, wherein drift of the arms 11, 12 is prevented during the application of the bolt 16. This is advantageous when the bracket 3 is to be installed or reinstalled together with the second apparatus part 2 in the lithographic apparatus, as described above, and/or during removal of the bracket 3 and second apparatus part 2 from the lithographic apparatus. The reproducibility of a desired position of the second apparatus part 2 is achieved by using the present form fixed mounting bracket 3. The present mounting bracket also has a relatively simple construction.

As shown in FIG. 4, the second slot 19 of the bracket may be partially filled by a removable bridging part 23 during the assembly of the bolt 16, for preventing certain displacements of the bracket arms 11, 12 with respect to each other. Such bridging part may be removed after the blocking member 15 and bolt 16 have been assembled, and the blocking state of the blocking member 15 has been obtained.

The fixing mechanism releases the first and second arms 11, 12 of the mounting bracket 3 when the fixing mechanism is in a releasing position. This releasing position can be achieved, for example, by loosening or removing the bolt 16, so that the blocking member 15 elastically returns to a relaxed releasing state, after which the blocking member is removed from the cylindrical aperture. After the removal of the blocking member 15, the second bracket arm 12 is mechanically decoupled from the first bracket arm 1, for example, for achieving a statically better defined construction and/or for preventing transmission of vibrations to the second apparatus part 2.

Figure 8:
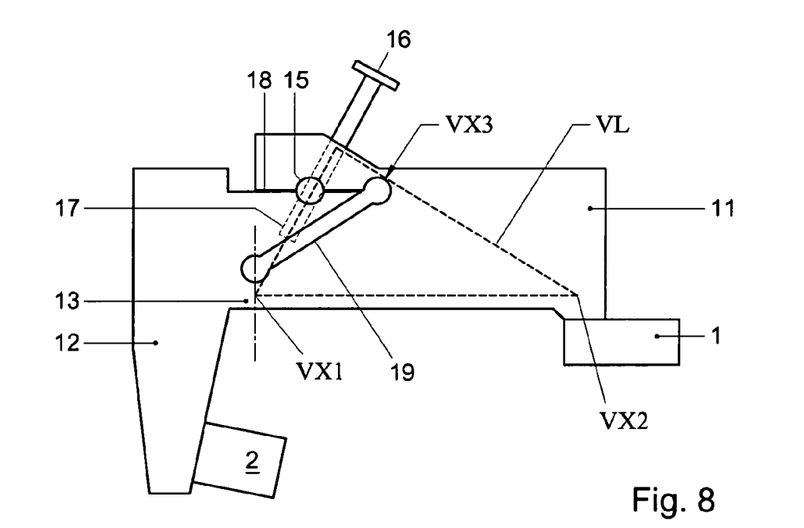
FIG. 8 is a side view of a second embodiment of the invention.

Referring to FIG. 8 the aperture 17 extends substantially perpendicular to a horizontal virtual pivot axis VX1 of the elastic part 3, such that the center line of the aperture 17 intersects that pivot axis VX1, when viewed in a vertical cross-section of the bracket. The aperture 17 extends substantially at a right angle with respect to a virtual straight line VL, extending from a virtual support axis VX2 of the first bracket arm 11 to a second horizontal pivot axis VX3. This second pivot axis VX3 is located above the upper part of the second slot 19. The virtual support axis VX2 is located at the same height as the pivot axis. The first bracket arm 11 is supported on a first apparatus part 1 extending under this support axis VX2. After assembly, the bolt 16 also extends in the perpendicular directions with respect to the pivot axis VX1 and the virtual line VL. Relatively little or no torques are applied to the mounting bracket when the bolt 16 is fastened for deforming the blocking member 15 to its blocking state, particularly torques which could result in a drift of the positioning of the first and second rigid bracket part with respect to one another. Thus, undesired repositioning of the first and second bracket arm with respect to one another is further prevented.

Figure 9:
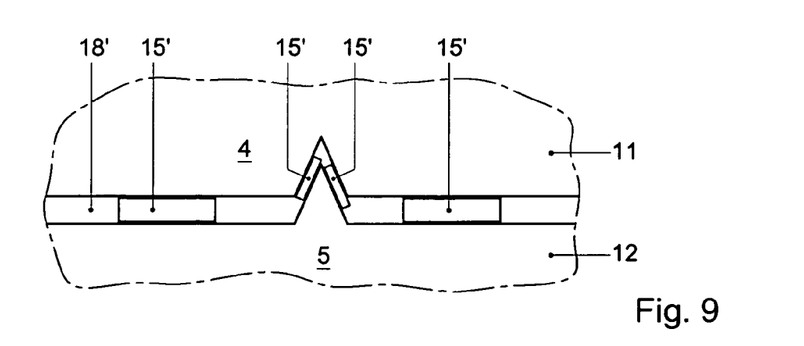
FIG. 9 is a view similar to the section shown in FIG. 7 of a third embodiment of the invention, wherein the slit of the bracket has been provided with blocking members.

Referring to FIG. 9 a slit 18' extends between the first and second bracket arms. The position of the slit 18' is similar to the position of the first slit 18. Part of the slit 18' is V-shaped, seen in cross-section. The slit 18' serves as a cavity which extends between opposite parts 4, 5 of the first and second arms 11, 12 of the mounting bracket 3. Blocking strips 15' are provided which fit in the slit 18'. The slit 18' and the blocking strips 15' are arranged to cooperate with each other for providing the form fixation. As shown in FIG. 9, four blocking strips 15' have been provided, two of which can be entered in the opposite parts of the V-shaped slit 18' and the other two can be entered in neighbouring horizontal slits. The blocking strips 15' may fit tightly in the slit 18', for example, by 'push-fitting', wherein the fitting is so tight that assembly and disassembly is achieved utilizing a wood or lead hammer without damaging the strips and slit. During use, the bracket can be stiffened by the application of the blocking strips 15'. Then, a form fixation can be achieved, particularly in a horizontal direction. After mounting, the blocking strips 15' may be removed, for providing a certain releasing of the first and second bracket arms 11, 12.

While specific embodiments of the invention have been described above, it will be appreciated that the invention may be practiced otherwise than as described. The description is not intended to limit the invention.

For example, one or more mounting brackets may be provided for coupling one or more parts of the apparatus to each another.

The bracket may have various shapes and dimensions. For example, the bracket may be L-shaped. On the other hand, the bracket may include arms which do not form an L-shaped bracket. The bracket may be, for example, curved, straight, or a combination of such forms. Additionally, the bracket may include a number of arms, each of the bracket arms have various shapes and dimensions, and, for example, rectangular, circular, square, curved and/or other cross-sections.

In this application, instead of the term 'rigidity', the term 'stiffness' may also be used. In the present application, the term 'rigid bracket part' can be construed as meaning a bracket part which is more rigid than the elastic part. For example, the dimensions of the rigid bracket parts and the elastic part may be chosen such, that the rigid parts of the bracket are more rigid than the elastic part.

The elastic part of the bracket may have a rigidity, or stiffness, which is lower than the rigidity of each of the first and second bracket arms. For example, the rigidity of the elastic part may be about 30%, or less, of the rigidity of each of the rigid bracket arms. Also, as an example, the rigidity of the elastic part 13 may be in the range of about 10%-20% of the rigidity of the rigid bracket arms 11, 12. The ratio between the rigidity of the elastic part and that of the first and second rigid bracket arms may be different, depending amongst others on the desired application of the bracket and/or the dimensions of the bracket.

What is claimed is:

1. A lithographic apparatus, comprising:
an illumination system configured to condition a beam of radiation;
a support configured to support a patterning device, the patterning device configured to impart the beam with a pattern in its cross-section;
a substrate table configured to hold a substrate;
a projection system configured to project the patterned beam onto a target portion of the substrate;
a mounting bracket configured to couple a second part of the apparatus to a first part of the apparatus, the mounting bracket comprising a first rigid part, a second rigid part, and an elastic part connecting the first and second rigid parts, the elastic part being less rigid than each of the rigid bracket parts, wherein a fixing mechanism is configured to fix the positions of the first rigid part and the second rigid part with respect to each other, and the fixing mechanism is configured to couple the first and second rigid parts of the mounting bracket substantially by form fixation.

2. An apparatus according to claim 1, wherein the fixing mechanism comprises a cavity which extends between opposite parts of the first and second rigid parts of the mounting bracket, a blocking member which fits in the cavity, and the cavity and blocking member are configured to cooperate with each other to provide the form fixation.

3. An apparatus according to claim 2, wherein the cavity is spaced-apart from the elastic part.

4. An apparatus according to claim 2, wherein the cavity is cylindrical.

5. An apparatus according to claim 4, wherein the blocking member is a cylindrical bush.

6. An apparatus according to claim 5, wherein the bush and the cavity fit by a clearance fit or a transition fit.

7. An apparatus according to claim 4, wherein a center axis of the cavity extends in a virtual plane, and the plane extends between opposite surfaces of the opposite parts of the first and second rigid parts of the mounting bracket.

8. An apparatus according to claim 2, wherein the blocking member extends substantially parallel to a virtual pivot axis of the elastic part.

9. An apparatus according to claim 2, wherein the blocking member is removable from the cavity.

10. An apparatus according to claim 2, wherein the blocking member is elastically deformable to a blocking state wherein the blocking member blocks the first and second rigid parts of the bracket via form fixation in the cavity.

11. An apparatus according to claim 5, wherein the bush is at least elastically deformable over about 16 μm.

12. An apparatus according to claim 10, further comprising a deformation mechanism configured to elastically deform the blocking member to the blocking state.

13. An apparatus according to claim 12, wherein the deformation mechanism comprises a bolt, and the bolt and the blocking member are configured to cooperate with each other to elastically deform the blocking member to the blocking state.

14. An apparatus according to claim 13, wherein the bracket comprises an aperture to receive the bolt.

15. An apparatus according to claim 13, wherein the bolt extends substantially perpendicular to the blocking member.

16. An apparatus according to claim 13, wherein the bolt is removable from the bracket.

17. An apparatus according to claim 13, wherein the bolt extends substantially perpendicular to a horizontal virtual pivot axis of the elastic part, such that the center line of the bolt intersects the horizontal virtual pivot axis, when viewed in a vertical cross-section of the bracket.

18. An apparatus according to claim 1, wherein the first part of the apparatus is a frame part.

19. An apparatus according to claim 1, wherein the second part of the apparatus comprises at least one sensor.

20. An apparatus according to claim 1, wherein the second part of the apparatus is configured to align different objects with respect to each other.

21. An apparatus according to claim 1, wherein the second rigid part of the bracket is arranged or provided with a device to determine a position of the substrate in at least one translation and/or rotational direction.

22. An apparatus according to claim 1, wherein the second part of the apparatus comprises at least one optical element.

23. An apparatus according to claim 22, wherein the optical element is a mirror.

24. An apparatus according to claim 22, wherein the optical element is a lens or prism.

25. An apparatus according to claim 1, wherein the first and second rigid parts are arms, and the arms form a substantially L-shaped bracket.

26. An apparatus according to claim 1, wherein the first rigid part, second rigid part and elastic part of the bracket are made in one piece.

27. An apparatus according to claim 1, wherein the bracket is made of at least one metal.

28. An apparatus according to claim 1, wherein a thickness of the elastic part of the bracket is smaller than the thickness of the first and second rigid parts of the bracket, when viewed in a longitudinal cross-section of the bracket, such that the elastic part is less rigid than each of the rigid parts.

29. An apparatus according to claim 28, wherein the thickness of the elastic part is less than half the thickness of the first rigid part.

30. An apparatus according to claim 28, wherein the thickness of the elastic bracket part is about 2 cm or less.

31. An apparatus according to claim 1, wherein the bracket comprises at least one slot which extends between the first and second rigid bracket parts to provide the elastic part of the bracket.

32. An apparatus according to claim 31, wherein the bracket comprises at least a first slot and an adjoining second slot, the first slot extends substantially parallel to a longitudinal direction of the first rigid part, and the second slot extends from the first slot towards the elastic part.

33. An apparatus according to claim 1, wherein the bracket is removable from the apparatus after the bracket has been mounted in the apparatus by removing the second part of the apparatus from the first part thereof.

34. An apparatus according to claim 1, wherein the fixing mechanism fixes the first and second rigid parts of the mounting bracket substantially by form fixation when the fixing mechanism is in a fixing position, and the fixing mechanism releases the first and second rigid parts of the mounting bracket when the fixing mechanism is in a releasing position.

35. A lithographic apparatus, comprising:
an illumination system configured to condition a beam of radiation;
a support configured to support a patterning device, the patterning device configured to impart the beam with a pattern in its cross-section;
a substrate table configured to hold a substrate;
a projection system configured to project the patterned beam onto a target portion of the substrate;
a mounting bracket configured to couple a second part of the apparatus to a first part of the apparatus, the mounting bracket comprising a first rigid part, a second rigid part, and an elastic part connecting the first and second rigid parts, the elastic part being less rigid than each of the rigid parts, wherein a removable blocking member is configured to couple the first and second rigid parts of the mounting bracket substantially by form fixation.

36. A bracket for coupling a second part of a lithographic apparatus to a first part of the lithographic apparatus, the bracket comprising: a first rigid part, a second rigid part, and an elastic part connecting the first and second rigid parts, the elastic part being less rigid than each of the rigid parts, wherein a fixing mechanism is provided to fix the positions of the first rigid part and the second rigid part with respect to each other, the fixing mechanism is configured to couple the first and second rigid parts of the mounting bracket substantially by form fixation.

37. A bracket according to claim 36, wherein the fixing mechanism comprises a cavity that extends between opposite parts of the first and second rigid parts of the mounting bracket, the fixing mechanism comprises a blocking member that fits in the cavity, and the cavity and blocking member are configured to cooperate with each other to provide the form fixation.

38. A bracket according to claim 36, wherein the cavity is cylindrical, and the blocking member is a cylindrical bush.

39. A bracket according to claim 36, wherein the blocking member is removable from the cavity.

40. A bracket according to claim 36, wherein the blocking member is elastically deformable to a blocking state wherein the blocking member blocks the first and second rigid part of the bracket via form fixation in the cavity.

41. A bracket according to claim 40, comprising a deformation mechanism configured to elastically deform the blocking member.

42. A bracket according to claim 41, wherein the deformation mechanism comprises a bolt, the bolt and the blocking member are configured to cooperate with each other to elastically deform the blocking member to a blocking state.

43. A bracket according to claim 36, wherein the second part of the lithographic apparatus comprises at least one sensor.

44. A bracket according to claim 36, wherein the second part of the apparatus is configured to align different objects with respect to each other.

45. A bracket according to claim 36, wherein the second rigid part of the bracket comprises a device to determine a position of a substrate in at least one of a translation and/or a rotational direction.

46. A bracket according to claim 36, wherein the second part of the apparatus comprises at least one optical element.

47. A bracket according to claim 46 wherein the optical element is a mirror.

48. A bracket according to claim 46, wherein the optical element is a lens or prism.

49. A bracket according to claim 36, wherein the first rigid part is a first bracket arm, the second rigid part is a second bracket arm, and the first and second bracket arms form a substantially L-shaped bracket or a substantially straight bracket or a substantially curved bracket.

50. A bracket according to claim 36, wherein the first rigid part, second rigid part and the elastic part of the bracket are made in one piece.

51. A bracket according to claim 36, wherein the bracket is made of at least one metal.

52. A bracket according to claim 36, wherein a thickness of the elastic part of the bracket is smaller than the thickness of the first and second rigid parts, when viewed in a longitudinal cross-section of the bracket, such that the elastic part has a rigidity of about 30% or less than the rigidity of the rigid parts.

53. A bracket according to claim 36, wherein a thickness of the elastic bracket part is less than half a thickness of the first rigid part.

54. A bracket according to claim 36, wherein a thickness of the elastic bracket part is about 2 cm or less.

55. A bracket according to claim 36, wherein the bracket comprises at least one slot that extends between the first and second rigid parts to provide the elastic part of the bracket.

56. A bracket according to claim 36, wherein the fixing mechanism fixes the first and second rigid parts of the mounting bracket substantially by form fixation when the fixing mechanism is in a fixing position, and the fixing mechanism releases the first and second rigid parts of the mounting bracket when the fixing mechanism is in a releasing position.

57. A bracket according to claim 36, wherein the rigidity of the elastic part is about 30% or less than the rigidity of each of the rigid parts.

58. A bracket for coupling a second part of a lithographic apparatus to a first part thereof, the bracket comprising a first rigid part, a second rigid part, and an elastic part connecting the first and second rigid parts, wherein a removable blocking member is configured to couple the first and second rigid parts of the mounting bracket substantially by form fixation.

* * * * *